United States Patent [19]

Shigihara et al.

[11] Patent Number: 5,282,219
[45] Date of Patent: Jan. 25, 1994

[54] SEMICONDUCTOR LASER STRUCTURE HAVING A NON-REFLECTION FILM

[75] Inventors: Kimio Shigihara; Toshitaka Aoyagi, both of Itami, Japan

[73] Assignee: Mitsubishi Denki Kabushiki Kaisha, Tokyo, Japan

[21] Appl. No.: 984,101

[22] Filed: Dec. 1, 1992

[30] Foreign Application Priority Data

Feb. 27, 1992 [JP] Japan .................................. 4-079316

[51] Int. Cl.$^5$ .............................................. H01S 3/19
[52] U.S. Cl. ...................................................... 372/49
[58] Field of Search ................................ 372/49, 69, 75

[56] References Cited

U.S. PATENT DOCUMENTS

| | | | |
|---|---|---|---|
| 4,147,409 | 4/1979 | Apfel | 372/49 |
| 4,993,036 | 2/1991 | Ikeda et al. | 372/50 |
| 5,020,066 | 5/1991 | Iga et al. | 372/45 |
| 5,031,186 | 7/1991 | Takigawa et al. | 372/49 |

FOREIGN PATENT DOCUMENTS

| | | | |
|---|---|---|---|
| 61-207091 | 9/1986 | Japan | H01S 3/18 |
| 6442880 | 2/1989 | Japan | H01S 3/18 |
| 1-129486 | 5/1989 | Japan | H01S 3/18 |
| 2-7589 | 1/1990 | Japan | H01S 3/18 |
| 2-94684 | 4/1990 | Japan | H01S 3/18 |
| 3-11781 | 1/1991 | Japan | H01S 3/18 |

OTHER PUBLICATIONS

Cox et al., "Infrared Filters of Antireflected Si, Ge, InAs, and InSb", Journal of the Optical Society of America, vol. 51, No. 7, 1961, pp. 714–718.

Marclay et al., "Stepwise-graded-index Multilayer Broadband Low-reflectivity Coating for AlGaAs/GaAs Power Lasers", Applied Physics Letters, vol. 55, No. 10, 1989, pp. 942–944.

*Primary Examiner*—Frank Gonzalez
*Attorney, Agent, or Firm*—Leydig, Voit & Mayer

[57] ABSTRACT

A semiconductor optical device includes a semiconductor laser having an effective refractive index $n_c$, a first film having a refractive index $n_1$ and a thickness $d_1$, a second film having a refractive index $n_2$ and a thickness $d_2$, and a third film having a refractive index $n_3$ and a thickness $d_3$. The first to third films are successively disposed on a facet of the semiconductor laser. In this structure, the refractive indices and thicknesses of the first to third films are determined so that a characteristic matrix Xa of the three films is equal to a characteristic matrix Y of a single film whose refractive index $n_f$ is the square root of the effective refractive index $n_c$ of the semiconductor laser and whose thickness is obtained by dividing an oscillation wavelength $\lambda$ of the semiconductor laser by $4n_f$ as represented by the following equation $$\begin{pmatrix} 0 & -\frac{i}{n_f} \\ -in_f & 0 \end{pmatrix} =$$

$$\begin{pmatrix} \cos\phi_1 & \frac{-i\sin\phi_1}{n_1} \\ -in_1\sin\phi_1 & \cos\phi_1 \end{pmatrix} \begin{pmatrix} \cos\phi_2 & \frac{-i\sin\phi_2}{n_2} \\ -in_2\sin\phi_2 & \cos\phi_2 \end{pmatrix}$$

$$\begin{pmatrix} \cos\phi_3 & \frac{-i\sin\phi_3}{n_3} \\ -in_3\sin\phi_3 & \cos\phi_3 \end{pmatrix}$$

where $\phi_1 = 2\pi n_1 d_1/\lambda$, $\phi_2 = 2\pi n_2 d_2/\lambda$, and $\phi_3 = 2\pi n_3 d_3/\lambda$. Therefore, a non-reflection film having no reflectivity at the oscillation wavelength of the semiconductor laser is attained, and the production of the non-reflection film is simplified.

5 Claims, 5 Drawing Sheets

SEMICONDUCTOR LASER STRUCTURE HAVING A NON-REFLECTION FILM

FIELD OF THE INVENTION

The present invention relates to semiconductor optical devices and, more particularly, to a semiconductor optical device having a non-reflection film on a light emitting facet of a laser structure and operating as a superluminescent diode or a semiconductor laser amplifier.

BACKGROUND OF THE INVENTION

FIG. 8 is a sectional view illustrating the structure of a non-reflection film included in a conventional semiconductor laser device disclosed in Journal of the Optical Society of America, Vol. 51, 1961, pp. 714-718, by J. T. Cox, G. Hass, and G. F. Jacobus. In FIG. 8, the non-reflection film comprises a first film 50 having a refractive index $n_1$ and a thickness $d_1 = \lambda/4n_1$ ($\lambda$: the oscillation wavelength of the semiconductor laser), a second film 51 having a refractive index $n_2$ and a thickness $d_2 = \lambda/4n_2$, and a third film 52 having a refractive index $n_3$ and a thickness $d_3 = \lambda/4n_3$. Reference numeral 100 designates a semiconductor laser having an effective refractive index $n_c$, and numeral 101 designates a facet of the semiconductor laser. The refractive indices $n_1$, $n_2$, $n_3$, and $n_c$ have following relations.

$$n_2{}^2 n_1 n_3 = n_3$$

$$n_c > n_1 > n_2 > n_3 \quad (1)$$

A description is given of the operation. Since the refractive indices of the first to third films 50 to 52 disposed on the laser facet 101 satisfy the formula (1) and the thicknesses thereof are $\lambda/4n_i$ ($i=1,2,3$), the phase of light traveling through the semiconductor laser 100 toward the facet 101 and the phase of light reflected by the facet 101 are opposite to each other, and the amplitudes thereof are equal to each other. Therefore, no reflection of light occurs at the laser facet 101. The semiconductor laser 100 with the non-reflection film does not oscillate because light generated in an active layer is not repeatedly reflected and amplified in the device.

As described above, when the non-reflection film is disposed on the facet of the semiconductor laser device, the laser oscillation is suppressed, whereby a superluminescent diode emitting incoherent light with a broad spectrum or a semiconductor laser amplifier amplifying incident light is realized.

In the prior art semiconductor optical device, however, in order to achieve the non-reflection film, materials having refractive indices that precisely satisfy the relations of the formula (1) are needed. Therefore, it is very difficult to manufacture the non-reflection film.

SUMMARY OF THE INVENTION

An object of the present invention is to provide a semiconductor optical device including a non-reflection film which is manufactured in a simple process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor optical device includes a semiconductor laser having an effective refractive index $n_c$, a first film having a refractive index $n_1$ and a thickness $d_1$, a second film having a refractive index $n_2$ and a thickness $d_2$, and a third film having a refractive index $n_3$ and a thickness $d_3$. The first to third films are disposed on a facet of the semiconductor laser. In this structure, the refractive indices and thicknesses of the first to third films are determined to satisfy a characteristic matrix Xa of the three films that is equal to a characteristic matrix Y of a single film whose refractive index $n_f$ is a square root of the effective refractive index $n_c$ of the semiconductor laser and whose thickness is obtained by dividing a oscillation wavelength $\lambda$ of the semiconductor laser by $4n_f$, as represented in the following equation;

$$\begin{pmatrix} 0 & -\dfrac{i}{n_f} \\ -in_f & 0 \end{pmatrix} =$$

$$\begin{pmatrix} \cos\phi_1 & -\dfrac{i\sin\phi_1}{n_1} \\ -in_1\sin\phi_1 & \cos\phi_1 \end{pmatrix} \begin{pmatrix} \cos\phi_2 & -\dfrac{i\sin\phi_2}{n_2} \\ -in_2\sin\phi_2 & \cos\phi_2 \end{pmatrix}$$

$$\begin{pmatrix} \cos\phi_3 & -\dfrac{i\sin\phi_3}{n_3} \\ -in_3\sin\phi_3 & \cos\phi_3 \end{pmatrix}$$

where $\phi_1 = 2\pi n_1 d_1/\lambda$, $\phi_2 = 2\pi n_2 d_2/\lambda$, and $\phi_3 = 2\pi n_3 d_3/\lambda$. Therefore, when the first to third films having arbitrary refractive indices are selected and the thicknesses of the first to third films are determined so that the characteristic matrix of the three films is equal to the characteristic matrix of the non-reflection film that is realized by the single film having an ideal refractive index and an ideal thickness, a non-reflection film having no reflectivity at the oscillation wavelength of the semiconductor laser is achieved, whereby the production of the non-reflection film is simplified.

According to a second aspect of the present invention, the first film and the third film have the same refractive index and thickness. Therefore, when two kinds of films having arbitrary refractive indices are selected and thicknesses of the two films are determined so that the characteristic matrix of the three films, i.e., the first to third films, is equal to the characteristic matrix of the non-refection film that is realized by a single film having ideal refractive index and thickness, a non-reflection film having no reflectivity at the oscillation wavelength of the semiconductor laser is achieved by only the two films, whereby the production of the non-reflection film is further simplified.

According to a third aspect of the present invention, first to third films having arbitrary refractive indices are selected and thicknesses of these films are determined so that the characteristic matrix of the three films is equal to the characteristic matrix of a non-reflection film that is realized by only a single film having ideal refractive index and thickness, and a film having an arbitrary refractive index $n_a$ and a thickness obtained by dividing the oscillation wavelength λ of the semiconductor laser by 2n_a is inserted at a boundary or several boundaries between the facet of the semiconductor laser, the first film, the second film, the third film, and the air. Therefore, a non-reflection film having no reflectivity at the oscillation wavelength of the semiconductor laser and having a high reflectivity at wavelengths region other than the oscillation wavelength is attained. As the result, a semiconductor optical device with a non-reflection film serving as a high-performance wavelength filter is easily attained.

DETAILED DESCRIPTION OF THE PREFERRED EMBODIMENTS

Figure 1:
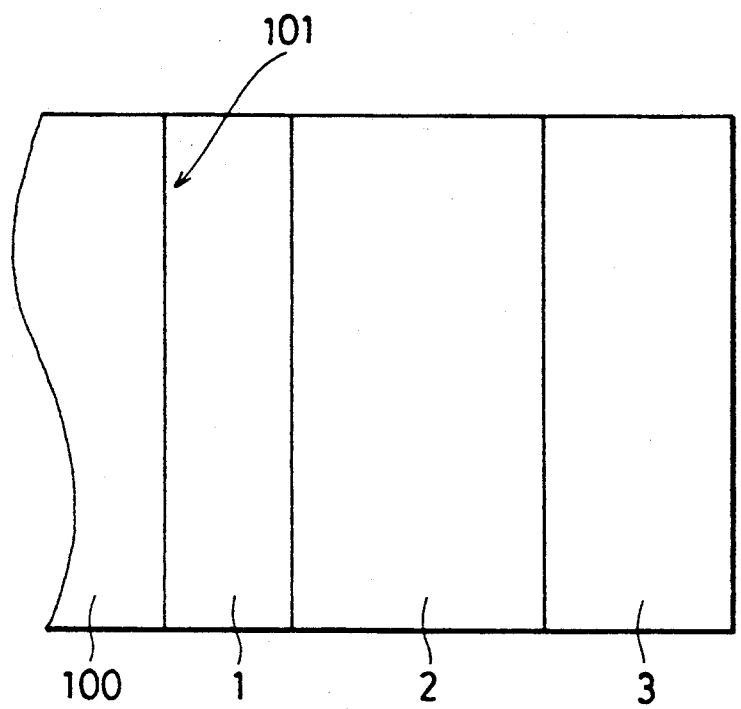
FIG. 1 is a sectional view illustrating a non-reflection film included in a semiconductor optical device in accordance with a first embodiment of the present invention.

FIG. 1 is a sectional view of a portion of a semiconductor optical device in accordance with a first embodiment of the present invention. In FIG. 1, reference numeral 100 designates a portion of a semiconductor laser device having an effective refractive index $n_c$, and numeral 101 designates a facet of the semiconductor laser. A first film 1 having a refractive index $n_1$ and a thickness $d_1$ is disposed on the facet 101, a second film 2 having a refractive index $n_2$ and a thickness $d_2$ is disposed on the first film 1, and a third film 3 having a refractive index $n_3$ and a thickness $d_3$ is disposed on the second film 2.

Figure 2:
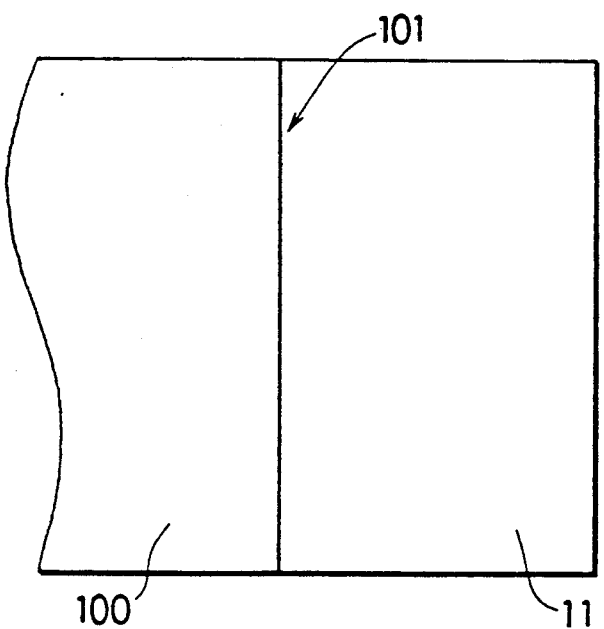
FIG. 2 is a sectional view illustrating a non-reflection film achieved by a single film having an ideal refractive index and an ideal thickness, which is disposed on a facet of a semiconductor laser.

FIG. 2 is a sectional view for explaining the first embodiment in more detail, in which reference numeral 11 designates a non-reflection film realized by a single film having an ideal refractive index $n_f$ and an ideal thickness $d_f$. The refractive index $n_f$ and the thickness $d_f$ have the following relations;

$$n_f = \sqrt{n_c}$$

$$d_f = \lambda/4n_f \qquad (2)$$

where λ is an oscillation wavelength of the semiconductor laser.

According to geometrical optics, the single film 11 of FIG. 2 is a perfect non-reflection film with reflectivity of zero. In this first embodiment, the perfect non-reflection film is achieved by the first to third films show FIG. 1. More specifically, when a characteristic matrix of the three films is Xa and a characteristic matrix of the single film 11 of FIG. 2 is Y, the thickness $d_1$, $d_2$, and $d_3$ of the first, second, and third films respectively having the refractive indices $n_1$, $n_2$, and $n_3$, are determined to satisfy the following equation (4) so that Xa is equal to Y;

$$\begin{pmatrix} 0 & -\frac{i}{n_f} \\ -in_f & 0 \end{pmatrix} = \begin{pmatrix} \cos\phi_1 & -\frac{i\sin\phi_1}{n_1} \\ -in_1\sin\phi_1 & \cos\phi_1 \end{pmatrix} \begin{pmatrix} \cos\phi_2 & -\frac{i\sin\phi_2}{n_2} \\ -in_2\sin\phi_2 & \cos\phi_2 \end{pmatrix} \begin{pmatrix} \cos\phi_3 & -\frac{i\sin\phi_3}{n_3} \\ -in_3\sin\phi_3 & \cos\phi_3 \end{pmatrix} \qquad (4)$$

where $\phi_1 = 2\pi n_1 d_1/\lambda$, $\phi_2 = 2\pi n_2 d_2/\lambda$, $\phi_3 = 2\pi n_3 d_3/\lambda$.

Then, the three films having the thicknesses thus determined are formed on the facet 101 of the semiconductor laser. Preferably, these films are formed by electron beam deposition, sputtering, thermal CVD, or the like.

As described above, according to the first embodiment of the present invention, the non-reflection film which is realized by only the single film 11 having an ideal refractive index and an ideal thickness is easily manufactured using the first to third films having arbitrary refractive indices by appropriately selecting the thicknesses of the three films.

Figure 3:
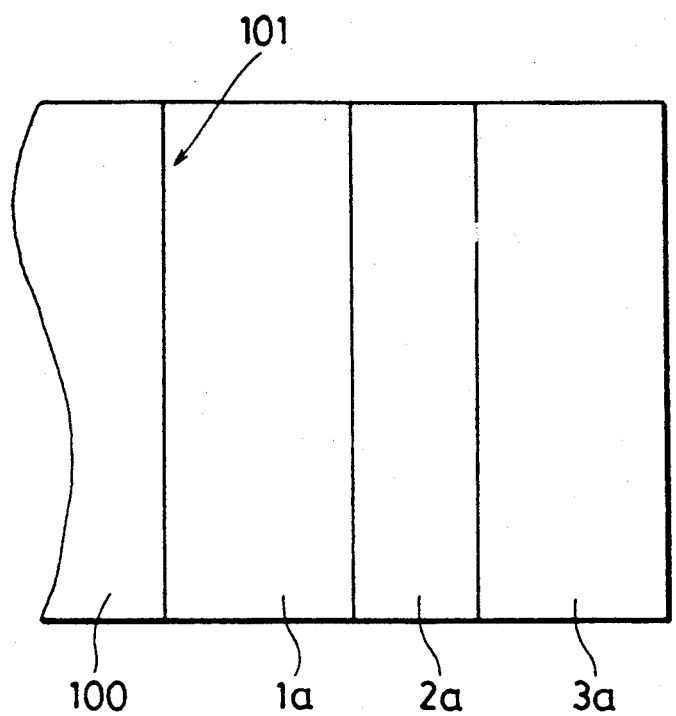
FIG. 3 is a sectional view illustrating a non-reflection film included in a semiconductor optical device in accordance with a second embodiment of the present invention.

FIG. 3 is a sectional view of a portion of a semiconductor optical device in accordance with a second embodiment of the present invention. In FIG. 3, the same reference numerals as in FIG. 1 designate the same or corresponding parts. A first film 1a having a refractive index $n_1$ and a thickness $d_1$ is disposed on the facet 101 of the semiconductor laser 100, a second film 2a having a refractive index $n_2$ and a thickness $d_2$ is disposed on the first film 1a, and a third film 3a having the same refractive index and thickness as those of the first film 1a is disposed on the second film 2a.

A characteristic matrix Xb of the three films according to this second embodiment is equal to the characteristic matrix Y of the non-reflection film realized by the single film 11 having ideal refractive index and thickness shown in FIG. 2 when the following equation (5) is satisfied.

$$\begin{pmatrix} 0 & -\frac{i}{n_f} \\ -in_f & 0 \end{pmatrix} = \begin{pmatrix} \cos\phi_1 & \frac{-i\sin\phi_1}{n_1} \\ -in_1\sin\phi_1 & \cos\phi_1 \end{pmatrix} \begin{pmatrix} \cos\phi_2 & \frac{-i\sin\phi_2}{n_2} \\ -in_2\sin\phi_2 & \cos\phi_2 \end{pmatrix} \begin{pmatrix} \cos\phi_1 & \frac{-i\sin\phi_1}{n_1} \\ -in_1\sin\phi_1 & \cos\phi_1 \end{pmatrix} \quad (5)$$

When the equation (5) is rearranged, the following simultaneous equations (6) are obtained.

$$\tan 2\phi_1 \cdot \tan\phi_2 = \frac{2}{\left(\frac{n_2}{n_1} + \frac{n_1}{n_2}\right)} \quad (6)$$

$$\tan\phi_2 = \frac{-n_1 n_2 (n_f{}^2 - n_1{}^2)\sin 2\phi_1}{n_1{}^2(n_f{}^2 - n_2{}^2)\cos^2\phi_1 + (n_1{}^4 - n_2{}^2 n_f{}^2)\sin^2\phi_1}$$

When the simultaneous equations (6) are solved with the refractive indices of the first to third films, thicknesses of the respective films are obtained.

As an example, when the oscillation wavelength λ of the semiconductor laser device is 1.3 microns and the effective refractive index $n_c$ thereof is 3.2, and the first and third films 1a and 3a comprise alumina (Al₂O₃) having a refractive index $n_1$ of 1.60 and the second film 2a comprises amorphous silicon (a-Si) having a refractive index of 3.4, the thickness of the first film 1a and the third film 3a is 902.3 angstroms and the thickness of the second film 2a is 82.5 angstroms. These thicknesses are the minimum values and, in actuality, innumerable periodic values of thicknesses may be used. When the non-reflection film comprising the first to third films 1a to 3a is actuality formed on a fact of the semiconductor laser with an oscillation wavelength of 1.3 microns, the laser oscillation is suppressed. When the spectrum is measured, a reflectivity of about 0.08% is detected.

As described above, according to the second embodiment of the present invention, the non-reflection film which is realized by only a single film having an ideal refractive index and thickness is easily manufactured using two kinds of materials having arbitrary refractive indices in such a manner that either of the two materials is sandwiched by the other material to make a three-layer lamination structure and the thicknesses of the three layers are appropriately selected.

Figure 4:
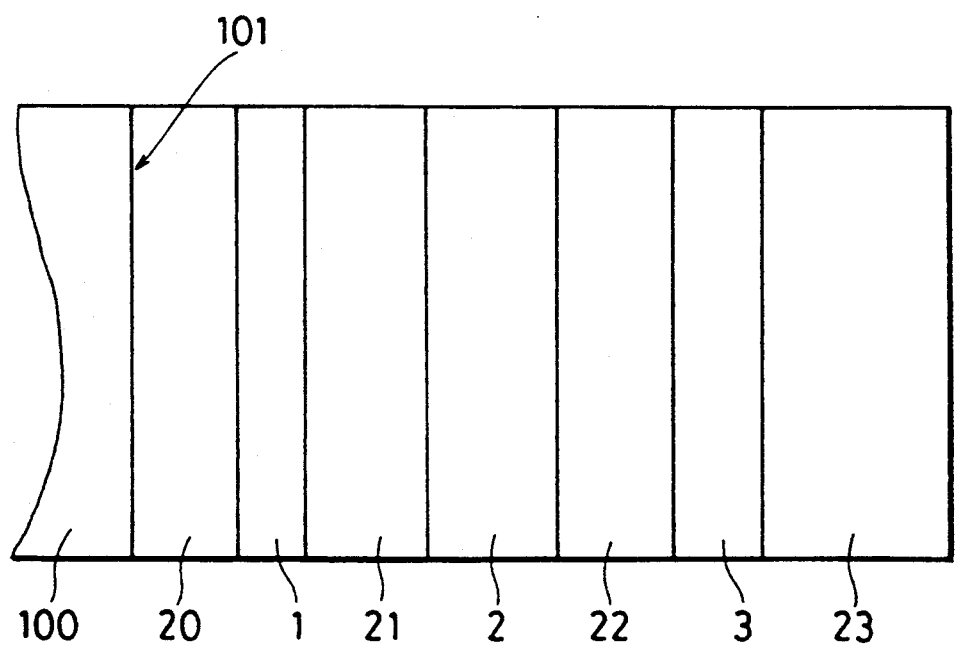
FIG. 4 is a sectional view illustrating a non-reflection film included in a semiconductor optical device in accordance with a third embodiment of the present invention.

FIG. 4 is a sectional view of a portion of a semiconductor laser device with a non-reflection film in accordance with a third embodiment of the present invention. In FIG. 4, the same reference numerals as in FIG. 1 designate the same or corresponding parts. Reference numeral 20 designates a film having a refractive index $n_a$ and a thickness $d_a = \lambda/2n_a$, numeral 21 designates a film having a refractive index $n_b$ and a thickness $d_b = \lambda/2n_b$, numeral 22 designates a film having a refractive index $n_c$ and a thickness $d_c = \lambda/2n_c$, and numeral 23 designates a film having a refractive index $n_d$ and a thickness $d_d = \lambda/2n_d$.

In this third embodiment, the film 20 is inserted between the semiconductor laser device 100 and the first film 1, the film 21 is inserted between the first film 1 and the second film 2, the film 22 is inserted between the second film 2 and the third film 3, and the film 23 is disposed on the third film 3.

Figure 5:
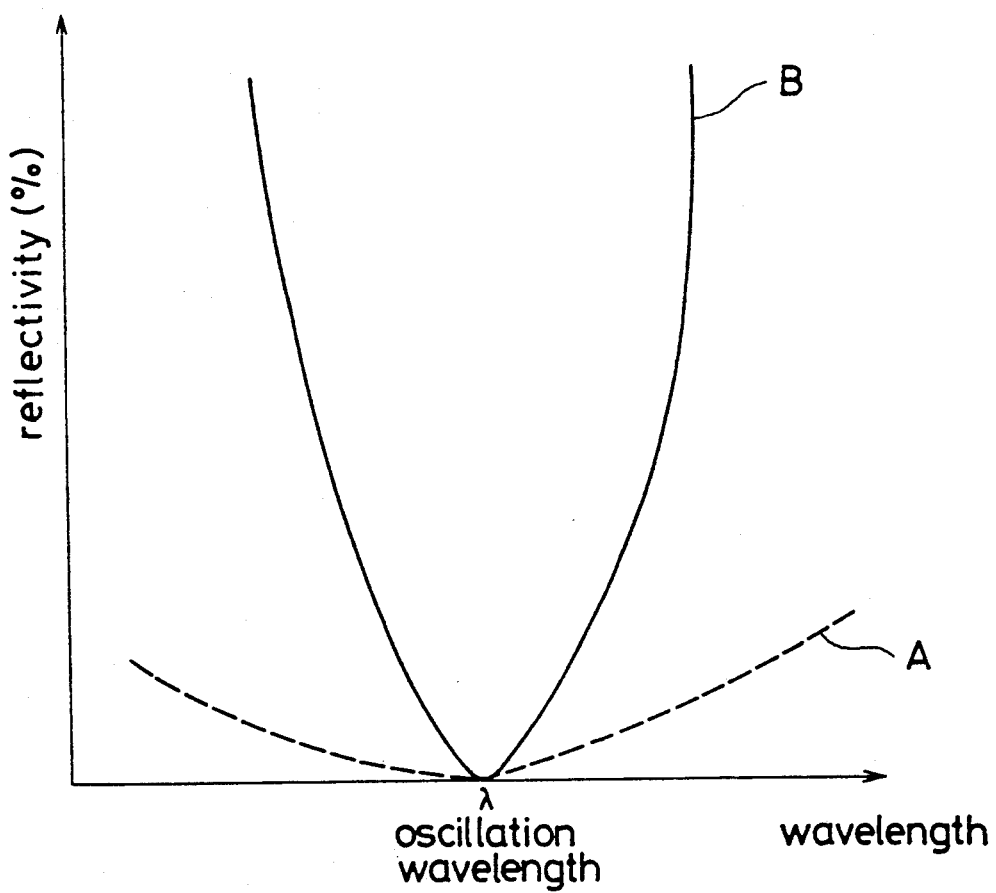
FIG. 5 is a graph for explaining operation of the third embodiment.

The operating principle of this third embodiment will be described using FIG. 5. In FIG. 5, a curve A shows reflectivity vs. wavelength characteristics with respect to the non-reflection film of the first embodiment, and a curve B shows reflectivity vs. wavelength characteristics with respect to the non-reflection film of the third embodiment. When the non-reflection film comprises three films, the reflectivity at the oscillation wavelength λ is zero and reflectivities in a wavelength region other than the oscillation wavelength λ are low, as shown by the curve A. On the other hand, when the non-reflection film comprises the seven films as shown in FIG. 4, the reflectivity at the oscillation wavelength λ is zero like the non-reflection film comprising the three films, but the reflectivity suddenly increases when the wavelength shifts a little from the oscillation wavelength λ, so that high reflectivities are produced at wavelengths other than at the oscillation wavelength λ. This results from a film having a refractive index N (N includes $n_a$, $n_b$, $n_c$, and $n_d$) and a thickness λ/2N that affects the reflectivity at wavelengths region other than the oscillation wavelength λ although the film does not affect the reflectivity at the oscillation wavelength λ.

In the above-described third embodiment, the film having the refractive index N and the thickness λ/2N is present at all boundaries between the semiconductor laser device, the first film, the second film, the third film, and the air, but the film may be present only at arbitrary ones of these boundaries.

In the non-reflection film of this third embodiment, a reflectivity equivalent to a reflectivity of the non-reflection film which is realized by only a single film having an ideal refractive index and thickness is obtained at the oscillation wavelength of the semiconductor laser, and high reflectivities are obtained at wavelengths region other than the oscillation wavelength. Therefore, the non-reflection film of this third embodiment can serve as a high-performance wavelength filter, so that the non-reflection film is effective when used in an amplifier for amplifying only one wavelength, such as a semiconductor laser amplifier.

Figure 6:
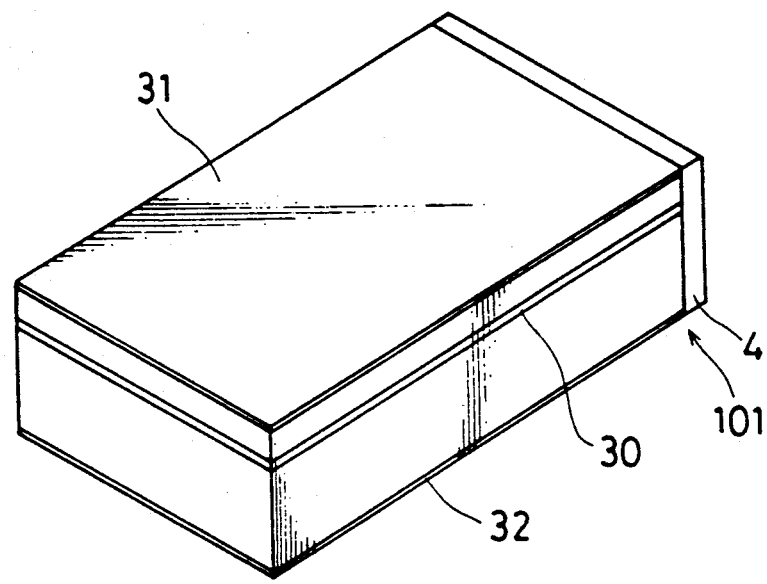
FIG. 6 is a perspective view illustrating a superluminescent diode as a semiconductor optical device in accordance with a fourth embodiment of the present invention.

FIG. 6 is a perspective view of a superluminescent diode as a semiconductor optical device in accordance with a fourth embodiment of the present invention. In FIG. 6, reference numeral 4 designates a non-reflection film according to one of the above-described first to third embodiments. Reference numeral 30 designates an active layer of the semiconductor laser, numeral 31 designates a p side electrode (or an n side electrode), and numeral 32 designates an n side electrode (or a p side electrode).

A description is given of the operation of the superluminescent diode. When a voltage in a forward direction relative to the p-n junction of the semiconductor laser is applied across the electrodes 31 and 32, carriers are injected into the active layer 30. The injected carriers recombine in the active layer 30 to generate light having a wavelength equivalent the energy band gap of the active layer 30. The light is transmitted in the active layer to reach the facet 101. Since the non-reflection film 4 is present on the facet 101, the light is not reflected by the facet 101 and return to the device but is emitted from the device. The light thus emitted is not laser light but incoherent light with a broad spectrum.

In this way, when the non-reflection film 4 according to one of the first to third embodiments of the present invention is present on the facet 101 of the semiconductor laser, the oscillation of the semiconductor laser is suppressed, resulting in a superluminescent diode with a broad spectrum.

While in the above-described fourth embodiment the non-reflection film 4 is present on a facet of the semiconductor laser to produce the superluminescent diode, the non-reflection film may be present on both facets of the laser.

According to the fourth embodiment of the present invention, since the non-reflection film 4, which is equivalent to the non-reflection film that is realized by only a single film having ideal refractive index and thickness, is disposed on either or both of the facets of the semiconductor laser, the oscillation of the semiconductor laser is suppressed, resulting in a high-performance superluminescent diode with a broad spectrum.

Figure 7:
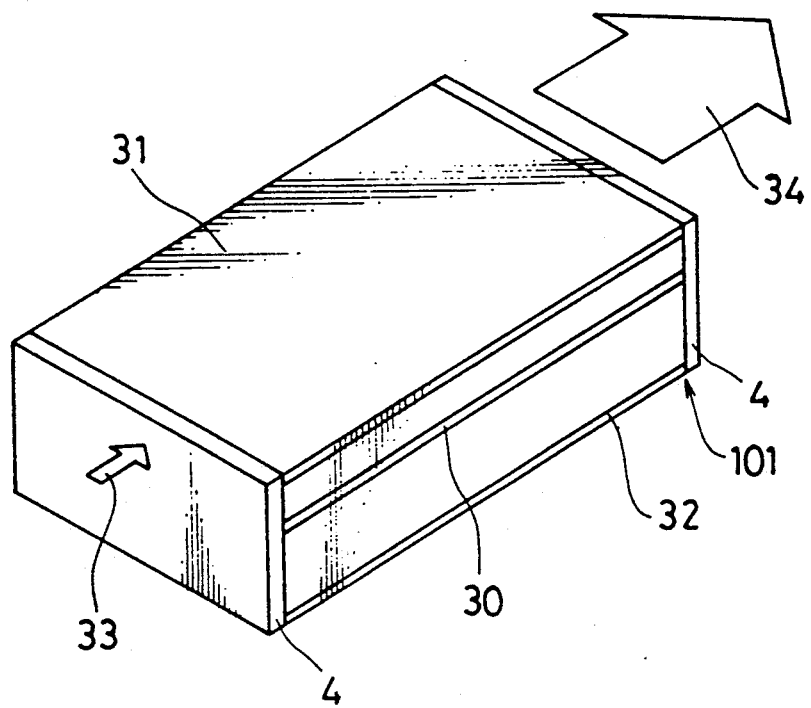
FIG. 7 is a perspective view illustrating a semiconductor laser amplifier as a semiconductor optical device in accordance with a fifth embodiment of the present invention.
Figure 8:
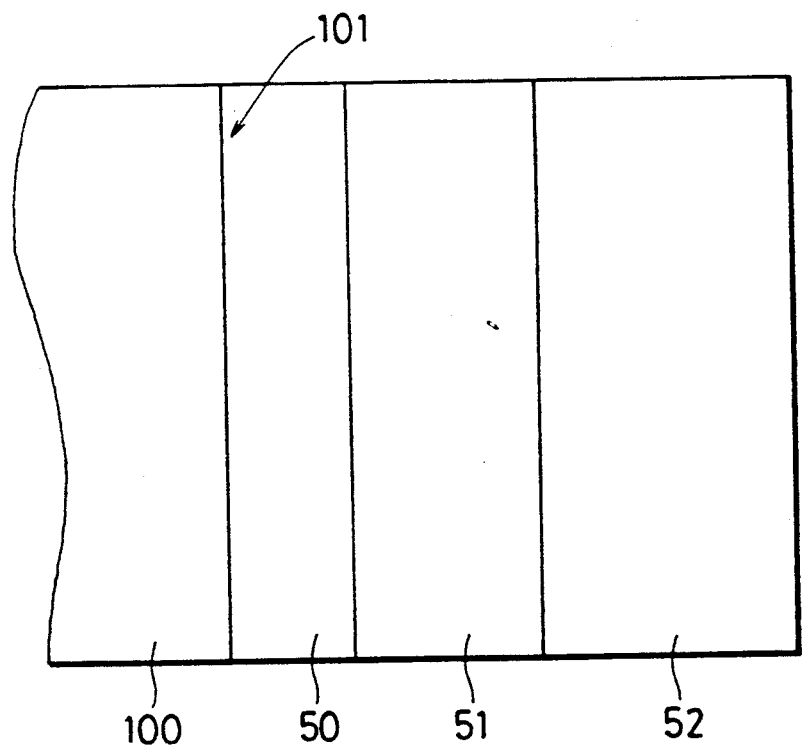
FIG. 8 is a sectional view illustrating a non-reflection film disposed on a facet of a semiconductor laser device in accordance with the prior art.

FIG. 7 is a perspective view of a semiconductor laser amplifier as a semiconductor optical device in accordance with a fifth embodiment of the present invention. In FIG. 7, the same reference numerals as in FIG. 6 designate the same or corresponding parts. A non-reflection film 4 according to one of the first to third embodiments is present on both facets of the semiconductor laser. Reference numeral 33 designates light incident on the semiconductor laser amplifier and numeral 34 designates light output from the semiconductor laser amplifier.

The incident light 33 is introduced into the active layer 30 of the semiconductor laser through the non-reflection film 4. Carriers are injected to the active layer 30 from the electrodes 31 and 32 and recombine to generate light. The incident light 33 is amplified by the light generated in the active layer and then output, as the output light 34, from the facet opposite to the light incident facet.

According to the fifth embodiment of the present invention, the non-reflection film 4, which is equivalent to the non-reflection film that is realized by only a single film having ideal refractive index and thickness, is disposed on both facets of the semiconductor laser to attain a high-performance semiconductor laser amplifier. Especially when the non-reflection film of the third embodiment serving as a high-performance wavelength filter is used as the non-reflection film 4, a high-performance semiconductor laser amplifier with low noise is attained.

As is evident from the foregoing description, according to the present invention, a non-reflection film disposed on a facet of a semiconductor laser comprises first to third films. The refractive indices and thicknesses of the three films are selected so that a characteristic matrix Xa of the three films is equal to a characteristic matrix Y of a single film whose refractive index $n_f$ is the square root of the effective refractive index $n_c$ of the semiconductor laser and whose thickness is obtained by dividing the oscillation wavelength $\lambda$ of the semiconductor laser by $4n_f$. Therefore, a non-reflection film equivalent to a non-reflection film realized by only the single film having ideal refractive index and thickness is achieved by the three films having arbitrary refractive indices by appropriately selecting the thicknesses of the three films. As the result, the production of the non-reflection film is simplified.

According to the present invention, in the above-described structure, the first film and the third film have the same refractive index and thickness. Therefore, the non-reflection film which is realized by only the single film having ideal refractive index and thickness is easily fabricated using two kinds of materials having arbitrary refractive indices in such a manner that either of the two materials is sandwiched by the other material to make a three-layer lamination structure and the thicknesses of the three layers are appropriately selected. As the result, the production of the non-reflection film is further simplified.

According to the present invention, in the above-described structure, a film having an arbitrary refractive index $n_a$ and a thickness obtained by dividing the oscillation wavelength $\lambda$ of the semiconductor laser device by $2n_a$ is inserted at one boundary at several boundaries between the facet of the semiconductor laser, the first film, the second film, the third film, and air. Therefore, a non-reflection film having no reflectivity at the oscillation wavelength of the semiconductor laser and having high reflectivities at wavelengths region other than the oscillation wavelength is achieved. As the result, a semiconductor optical device with a non-reflection film serving as a high-performance wavelength filter is easily attained.

What is claimed is:

1. A semiconductor optical device comprising:
a semiconductor laser element having an effective refractive index $n_c$ and a facet and oscillating at a wavelength $\lambda$;
a first film having a refractive index $n_1$ and a thickness $d_1$, a second film having a refractive index $n_2$ and a thickness $d_2$, and a third film having a refractive index $n_3$ and a thickness $d_3$ successively disposed on a facet of the semiconductor laser device wherein a characteristic matrix Xa for the three films combined that is equal to a characteristic matrix Y of a single film having a refractive index $n_f$ equal to the square root of said effective refractive index $n_c$ of said semiconductor laser element and a thickness equal to the wavelength $\lambda$ divided by $4n_f$ as represented by the following equation $$\begin{pmatrix} 0 & -\frac{i}{n_f} \\ -in_f & 0 \end{pmatrix} =$$

$$\begin{pmatrix} \cos\phi_1 & \frac{-i\sin\phi_1}{n_1} \\ -in_1\sin\phi_1 & \cos\phi_1 \end{pmatrix} \begin{pmatrix} \cos\phi_2 & \frac{-i\sin\phi_2}{n_2} \\ -in_2\sin\phi_2 & \cos\phi_2 \end{pmatrix}$$

$$\begin{pmatrix} \cos\phi_3 & \frac{-i\sin\phi_3}{n_3} \\ -in_3\sin\phi_3 & \cos\phi_3 \end{pmatrix}$$

where $\phi_1 = 2\pi n_1 d_1/\lambda$, $\phi_2 = 2\pi n_2 d_2/\lambda$, and $\phi_3 = 2\pi n_3 d_3/\lambda$.

2. The semiconductor optical device of claim 1 wherein said first film and said third film have the same refractive index and thickness.

3. The semiconductor optical device of claim 1 wherein a film having an arbitrary refractive index $n_a$ and a thickness equal to the wavelength $\lambda$ divided by $2n_a$ is disposed between at least one of said facet of said semiconductor laser element and said first film, said first film and said second film, said second film and said third film, and said third film and air.

4. The semiconductor optical device of claim 1 wherein said device is a superluminescent diode.

5. The semiconductor optical device of claim 1 wherein said device is a semiconductor laser amplifier.

* * * * *